US011854642B2

(12) United States Patent
Chang et al.

(10) Patent No.: US 11,854,642 B2
(45) Date of Patent: Dec. 26, 2023

(54) MEMORY TEST METHODS AND RELATED DEVICES

(71) Applicant: CHANGXIN MEMORY TECHNOLOGIES, INC., Anhui (CN)

(72) Inventors: Heng-Chia Chang, Hefei (CN); Li Ding, Hefei (CN); Chuanqi Shi, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 188 days.

(21) Appl. No.: 17/310,414

(22) PCT Filed: Oct. 15, 2020

(86) PCT No.: PCT/CN2020/121289
§ 371 (c)(1),
(2) Date: Jul. 31, 2021

(87) PCT Pub. No.: WO2021/179600
PCT Pub. Date: Sep. 16, 2021

(65) Prior Publication Data
US 2022/0343994 A1    Oct. 27, 2022

(30) Foreign Application Priority Data

Mar. 11, 2020 (CN) .......................... 202010167406.4

(51) Int. Cl.
*G11C 29/46* (2006.01)
*G11C 29/44* (2006.01)
*G11C 29/56* (2006.01)
(52) U.S. Cl.
CPC .......... *G11C 29/46* (2013.01); *G11C 29/4401* (2013.01); *G11C 29/56004* (2013.01)

(58) Field of Classification Search
CPC .............. G11C 29/70; G11C 29/56004; G11C 29/56008; G11C 29/4401; G11C 29/46;
(Continued)

(56) References Cited

U.S. PATENT DOCUMENTS 6,247,153 B1 * 6/2001 Jeon ....................... G11C 29/56
714/719
7,231,562 B2   6/2007 Ohlhoff et al.
(Continued)

FOREIGN PATENT DOCUMENTS

CN         1434458 A     8/2003
CN       102339649 A     2/2012
(Continued)

OTHER PUBLICATIONS

International Search Report (ISR) in the PCT/CN2020/121289 dated Jan. 15, 2021.
(Continued)

*Primary Examiner* — Tuan T Nguyen
(74) *Attorney, Agent, or Firm* — SYNCODA LLC; Feng Ma

(57) ABSTRACT

A memory test method includes: testing a first memory to acquire defect information of the first memory; acquiring repair information of the first memory according to the defect information of the first memory; and storing the repair information of the first memory in a second memory. In the technical solutions provided in the embodiments of the present disclosure, other memories may be used to store the repair information of the currently tested memory, so that the storage space can be increased and the test efficiency can be improved.

13 Claims, 10 Drawing Sheets

(58) Field of Classification Search
CPC . G11C 29/40; G11C 5/025; G11C 2029/5606; G11C 29/4402
See application file for complete search history.

(56) References Cited

U.S. PATENT DOCUMENTS

| | | | | |
|---|---|---|---|---|
| 7,237,154 | B1* | 6/2007 | Zorian | G11C 29/56008 |
| | | | | 714/721 |
| 7,359,261 | B1* | 4/2008 | Wu | G06F 11/0793 |
| | | | | 365/201 |
| 7,523,366 | B2 | 4/2009 | Chung | |
| 8,010,852 | B1* | 8/2011 | Yang | G11C 29/028 |
| | | | | 714/718 |
| 8,432,758 | B2 | 4/2013 | Jeong et al. | |
| 8,787,060 | B2* | 7/2014 | Lee | G11C 7/1084 |
| | | | | 365/51 |
| 10,754,724 | B2 | 8/2020 | Byun et al. | |
| 10,847,244 | B2 | 11/2020 | Kim et al. | |
| 11,393,553 | B2* | 7/2022 | Shi | G11C 29/4401 |
| 2003/0107926 | A1 | 6/2003 | Ohmura et al. | |
| 2004/0260987 | A1 | 12/2004 | Ohlhoff et al. | |
| 2005/0149803 | A1 | 7/2005 | Hirano et al. | |
| 2009/0137070 | A1 | 5/2009 | Co et al. | |
| 2012/0173921 | A1 | 7/2012 | Wuu et al. | |
| 2014/0281693 | A1 | 9/2014 | Jeddeloh et al. | |
| 2019/0258538 | A1 | 8/2019 | Byun et al. | |

FOREIGN PATENT DOCUMENTS

| | | |
|---|---|---|
| CN | 105551528 A | 5/2016 |
| CN | 109215724 A | 1/2019 |
| CN | 110120242 A | 8/2019 |

OTHER PUBLICATIONS

CN first office action in Application No. 202010167406.4, dated Feb. 22, 2022.
Extended European Search Report in Application No. 20924843.4, dated Apr. 25, 2022.

* cited by examiner

MEMORY TEST METHODS AND RELATED DEVICES

CROSS-REFERENCE TO RELATED APPLICATIONS

This application is a national stage of International Application No. PCT/CN2020/121289 filed on Oct. 15, 2020, which claims priority to Chinese Patent Application No. 202010167406.4 filed on Mar. 11, 2020. The disclosures of these applications are hereby incorporated by reference in their entirety.

TECHNICAL FIELD

The present disclosure relates to the technical field of semiconductor device testing, in particular to memory test methods and related devices.

BACKGROUND

As the semiconductor process size is getting smaller and the IC (Integrated Circuit) design is getting larger, highly complex IC products are facing increasingly grim challenges in terms of high reliability, high quality, low cost, and shorter product manufacturing period. On one hand, as the semiconductor process size is getting smaller, memories may have more types of defects; and on the other hand, as the complexity of IC products increases, the proportion of memories such as RAMs (Random Access Memories) in IC products is growing.

The DRAM (Dynamic Random-Access Memory) test is taken as an example. A memory space internal to the ATE (Automatic Test Equipment) used to test a memory is required to record the defect location of the memory and the spare circuit information, repair information is generated by the ATE analysis operation behavior, and then the memory is repaired.

When a large-capacity memory is tested or when precise analysis is required, the memory space internal to the ATE may be insufficient, and the test may be forced to be suspended. In this case, multiple tests and repairs may be required, resulting in increased test cost. In related technologies, due to the limited memory space internal to the ATE, defect location storage and defect analysis may not be supported. Increasing the memory space of the ATE may cause the ATE very expensive, or the increase in the memory space has reached the limit of the ATE.

One of the solutions in the related technologies is to test through high-rate compression. However, the high-rate compression test is prone to problems such as failed repair and reduced yield.

It should be noted that the information disclosed in the background section is only provided to enhance the understanding of the background of the present disclosure, and therefore may include information that does not constitute the existing technologies known to a person of ordinary skill in the art.

SUMMARY

The purpose of the present disclosure is to overcome the shortcomings of the existing technologies, and provide a memory test method and related devices, which can overcome the technical problem in the related technologies that no sufficient storage space can be provided for defect information and repair information etc. during the memory test due to the limited memory space of the ATE.

An embodiment of the present disclosure provides a memory test method, comprising: testing a first memory to acquire defect information of the first memory; acquiring repair information of the first memory according to the defect information of the first memory; and storing the repair information of the first memory in a second memory.

In some exemplary embodiments of the present disclosure, before testing the first memory, the method further comprises: testing the second memory to acquire defect information of the second memory; storing the defect information of the second memory; acquiring repair information of the second memory according to the defect information of the second memory; and repairing the second memory according to the repair information of the second memory.

In some exemplary embodiments of the present disclosure, the first memory and the second memory belong to a same storage device.

In some exemplary embodiments of the present disclosure, the storage device further comprises a control die and the first memory and the second memory are vertically stacked above or below the control die in sequence.

In some exemplary embodiments of the present disclosure, the first memory and the second memory belong to different storage devices, and the types of the different storage devices are the same or different.

In some exemplary embodiments of the present disclosure, the method further comprises: testing a third memory to acquire defect information of the third memory; acquiring repair information of the third memory according to the defect information of the third memory; and storing the repair information of the third memory in the second memory.

In some exemplary embodiments of the present disclosure, the method further comprises: reading the repair information of the first memory and the repair information of the third memory from the second memory; and repairing the first memory according to the repair information of the first memory, and repairing the third memory according to the repair information of the third memory.

In some exemplary embodiments of the present disclosure, the method further comprises: reading the repair information of the first memory from the second memory; and repairing the first memory according to the repair information of the first memory.

In some exemplary embodiments of the present disclosure, the method further comprises: testing a fourth memory to acquire defect information of the fourth memory; acquiring repair information of the fourth memory according to the defect information of the fourth memory; and storing the repair information of the fourth memory in the first memory.

In some exemplary embodiments of the present disclosure, the method further comprises: acquiring test data of the first memory; and storing the test data of the first memory in the second memory.

In some exemplary embodiments of the present disclosure, the method is executed by an automatic test equipment.

An embodiment of the present disclosure provides a memory test apparatus, comprising: a defect information acquisition unit, configured to test a first memory to acquire defect information of the first memory; a repair information acquisition unit, configured to acquire repair information of the first memory according to the defect information of the first memory; and a repair information storage unit, configured to store the repair information of the first memory in a second memory.

An embodiment of the present disclosure provides an electronic device, comprising: one or more processors; and a storage apparatus, configured to store one or more programs; and the one or more programs causes, when executed by the one or more processors, the one or more processors to implement the method described in the embodiments.

An embodiment of the present disclosure provide a computer-readable storage medium having a computer program stored thereon, when executed by a processor, causes the processor to implement the method described in the embodiments.

The memory test method and apparatus, electronic device, and computer-readable storage medium provided in some embodiments of the present disclosure can use memories other than the ATE to store the repair information of the tested memory which is under test, thereby increasing the storage space for the repair information of the tested memory. On one hand, for the test of a large-capacity memory, there is no need to increase the memory space internal to the ATE, which reduces the test cost; and on the other hand, there is no need to repair the tested memory for multiple times, which improves the test speed, speeds up the test process, and shortens the test time.

It should be understood that the aforementioned general description and following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort.

DETAILED DESCRIPTION

Figure 1:
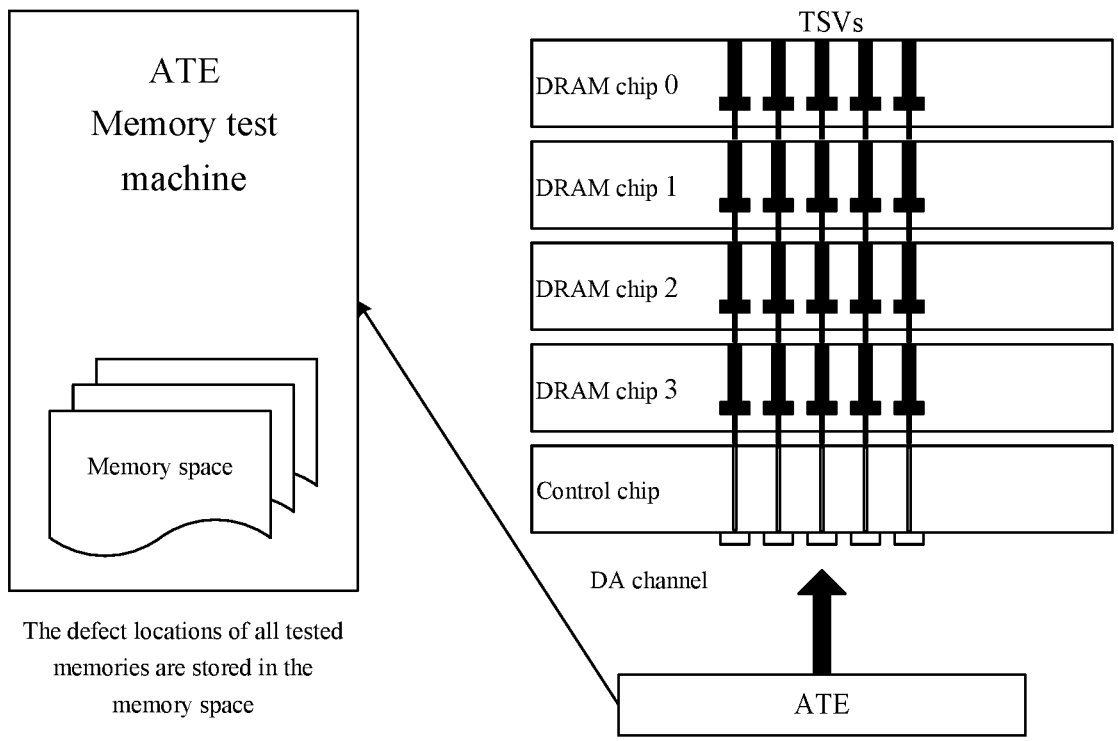
FIG. 1 shows a schematic diagram of testing a DRAM in the related technologies.

Exemplary implementations will now be described more fully with reference to the accompanying drawings. However, the exemplary implementations may be implemented in various forms, and should not be construed as being limited to the implementations set forth herein; instead, these implementations are provided to make the present disclosure more comprehensive and complete, and to fully convey the concepts of the exemplary implementations to those skilled in the art. The same reference numerals in the figures denote the same or similar structures, and thus the repeated description thereof will be omitted. In addition, the drawings are merely schematic illustrations of the present disclosure, and are not necessarily drawn to scale.

Although relative terms such as "upper" and "lower" are used in this specification to describe the relative relationship between one component and another component as shown, these terms are used in this specification just for convenience, for example, in the direction as shown in the drawings. It can be understood that, if the apparatus as shown is turned upside down, the component described as "upper" will become the "lower" component. When a structure is arranged "on" other structures, it may mean that the structure is integrally formed on the other structures, or that the structure is "directly" arranged on the other structures, or that the structure is "indirectly" arranged on the other structures through another structure.

The terms "a", "an", "the", "said" and "at least one" are used to indicate the presence of one or more elements/components/etc.; the terms "comprising" and "having" are used to indicate non-exclusive inclusion and indicate the presence of other elements/components/etc. in addition to the listed elements/components/etc.; and the terms "first" and "second" are used only as marks, rather than limiting the number of objects.

FIG. 1 shows a schematic diagram of testing a DRAM in the related technologies. As shown in FIG. 1, a storage device comprising four DRAM chips (DRAM chips 0-3) stacked on a control die is taken as an example. The four DRAM chips are electrically connected through TSVs (Through Silicon Vias).

In related technologies, testing the DRAM chips 0-3 of the storage device by ATE comprises the following steps:

1. The ATE tests the DRAM chip 0, detects the defect location and the spare circuit information of the DRAM chip 0.

2. The ATE stores the defect location of the DRAM chip 0 in the memory space internal to the ATE, and analyzes it to acquire the repair information of the DRAM chip 0.

3. The DRAM chip 0 is repaired according to the repair information of the DRAM chip 0 stored in the memory space internal to the ATE.

4. The ATE tests the DRAM chip 0 again, until it is confirmed that the DRAM chip 0 is repaired successfully.

5. The ATE tests the DRAM chip 1, detects the defect location and the spare circuit information of the DRAM chip 1.

6. The ATE stores the defect location of the DRAM chip 1 in the memory space internal to the ATE, and analyzes it to acquire the repair information of the DRAM chip 1.

7. The DRAM chip 1 is repaired according to the repair information of the DRAM chip 1 stored in the memory space internal to the ATE.

8. The ATE tests the DRAM chip 1 again, until it is confirmed that the DRAM chip 1 is repaired successfully.

9. The ATE tests the DRAM chip 2, detects the defect location and the spare circuit information of the DRAM chip 2.

10. The ATE stores the defect location of the DRAM chip 2 in the memory space internal to the ATE, and analyzes it to acquire the repair information of the DRAM chip 2.

11. The DRAM chip 2 is repaired according to the repair information of the DRAM chip 2 stored in the memory space internal to the ATE.

12. The ATE tests the DRAM chip 2 again, until it is confirmed that the DRAM chip 2 is repaired successfully.

13. The ATE tests the DRAM chip 3, detects the defect location and the spare circuit information of the DRAM chip 3.

14. The ATE stores the defect location of the DRAM chip 3 in the memory space internal to the ATE, and analyzes it to acquire the repair information of the DRAM chip 3.

15. The DRAM chip 3 is repaired according to the repair information of the DRAM chip 3 stored in the memory space internal to the ATE.

16. The ATE tests the DRAM chip 3 again, until it is confirmed that the DRAM chip 3 is repaired successfully.

Thus, in the related technologies, the defect location and repair information of all tested memories are stored in the memory space internal to the ATE. When a large-capacity memory is tested or when precise analysis is required, the memory space internal to the ATE may be insufficient, and the test may be forced to be suspended. In this case, multiple tests and repairs may be required, resulting in increased test cost.

Figure 2:
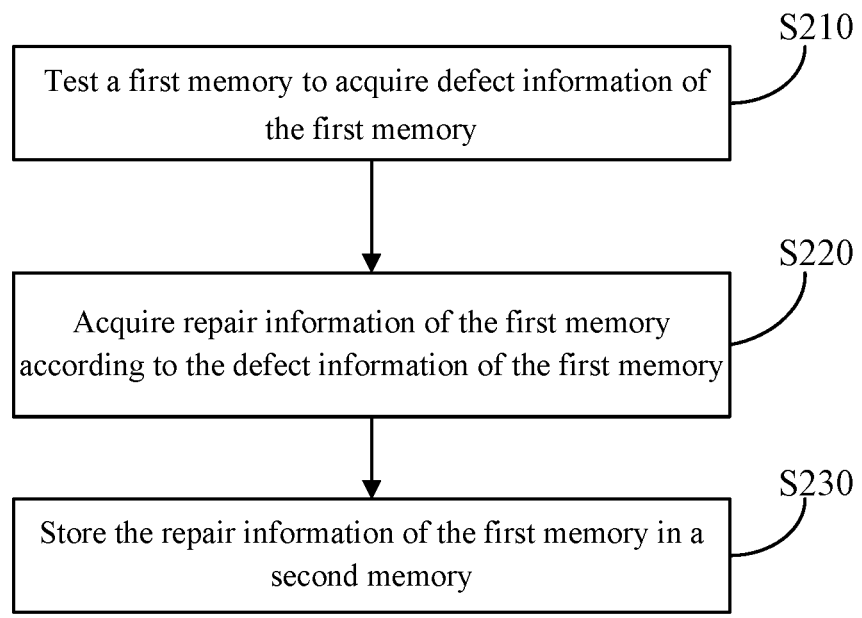
FIG. 2 schematically shows a flowchart of a memory test method according to an embodiment of the present disclosure.

FIG. 2 schematically shows a flowchart of a memory test method according to an embodiment of the present disclosure. As shown in FIG. 2, the method according to an embodiment of the present disclosure may comprise the following steps.

In an exemplary embodiment, the method may be executed by automatic test equipment. However, the present disclosure is not limited thereto. In other embodiments, the method may be executed by a BIST (Built-in Self Test) circuit. The BIST circuit may be arranged in a tested control die, or may be arranged in a memory chip for example a DRAM chip. The DRAM chip and the tested control die may belong to a same storage device, or may belong to different storage devices. In the following embodiments, execution of the test by the ATE is taken as an example.

In S210, the first memory is tested to acquire defect information of the first memory.

In the embodiment of the present disclosure, the first memory may be a memory of any type. For example, it may be a DRAM, an SRAM (Static Random-Access Memory), an NAND (Not AND, a flash memory device), an NOR (Not Or, also a flash memory device), etc. The first memory may be a certain memory chip or some memory chips or all memory chips in a certain storage device, or may be multiple memory chips located on multiple different storage devices. The storage types of these different storage devices may be the same or different. For example, they may all be DRAMs; they may all be SRAMs; or, some of them may be DRAMs and some of them may be SRAMs; or, some of them may be non-volatile memories such as NAND or NOR, etc. This is not limited in the present disclosure.

In an exemplary embodiment, the storage device having the first memory may further comprise a control die, and the first memory may be vertically stacked above or below the control die.

In an exemplary embodiment, the first memory may comprise multiple memory chips, and the multiple memory chips belong to a same storage device. And, the control die and the multiple memory chips also belong to the same storage device. In some embodiments, the multiple memory chips of the first memory may be vertically stacked above the control die in sequence. In further embodiments, the multiple memory chips of the first memory may be vertically stacked below the control die in sequence. In other embodiments, the multiple memory chips of the first memory may be vertically stacked in sequence, and the multiple memory chips, which are vertically stacked in sequence, may be horizontally interconnected with the control die. In still other embodiments, the multiple memory chips of the first memory and the control die may be horizontally distributed on the storage device. This is not limited in the present disclosure.

When the ATE executes the test method, various test vectors configured to test the first memory may be synthesized by a computer through a test vector generation algorithm. Then, the ATE reads these test vectors from the computer, and sends the read test vectors to the first memory for testing. Alternatively, the test vector generation algorithm may be built in the ATE, so that the test vectors are generated by the ATE itself. When the multiple memory chips in the storage device corresponding to the control die have independent external pins respectively, the ATE can directly send the test vectors to the memory chips through the independent external pins of the memory chips, to test the memory chips in parallel. When the multiple memory chips in the storage device corresponding to the control die share the external pins, first, it is necessary to determine the memory chip(s), among the multiple memory chips, to which the test vectors are to be sent. In this case, the ATE may send the acquired test vectors to the control die, and then the control die determines which memory chip is the first memory and then sends the received test vectors to the first memory for testing. In this way, the ATE can test multiple memory chips in parallel by using a small number of the external pins of the storage device, without being limited by the number of peripheral pins of the storage device.

In the embodiment of the present disclosure, the first memory may be tested by the ATE. For example, the ATE inputs and writes a known character string of "0" and/or "1" into storage units corresponding to addresses of the first memory. After a certain delay, the ATE reads these character strings from the storage units corresponding to the addresses, and performs an XOR operation on the character string input previously and the character string read later in sequence, to determine which storage unit has an error. Then, the address of the storage unit having an error may be recorded, that is, the defect information of the first memory may comprise one or more addresses corresponding to one or more storage units having an error in the first memory, which may be called the defect location.

It is to be noted that the test method for the first memory is not limited to the above-exemplified method, and any other method may be used to test the first memory. In addition, the present disclosure is not limited to testing the first memory by the ATE. For example, the first memory may be tested by a BIST circuit, the first memory may be tested by both the ATE and the BIST circuit, or the first memory may be tested by other electronic devices with test functions.

In S220, repair information of the first memory is acquired according to the defect information of the first memory.

In the embodiment of the present disclosure, the ATE may analyze the cause of error based on the defect information of the first memory acquired above, and acquire repair information on how to repair the defect location. The repair information of the first memory here may comprise the address, i.e., defect location (part of the defect information), corresponding to the storage unit having an error in the first memory, and the repair information on how to repair the defect location. In other embodiments, the repair information of the first memory may further comprise spare circuit information in the first memory. Spare circuit information refers to the design of some redundant spare storage units in a memory, in addition to the storage units conventionally designed to store data, in order to ensure the reliability of use, which is called the redundant design of the memory. For example, in addition to the conventional 10,000 storage units, the first memory further comprises 200 spare storage units in the first memory. When an error is found in the conventional 10,000 storage units during testing or when in use, the storage units with errors may be directly replaced with the spare storage units. The replacement here refers to the replacement of the addresses of the storage units, not physical replacement. Alternatively, during the repair of the storage units with errors, to ensure the normal use of the memory, the spare storage units may be used before the storage units with errors are repaired.

In S230, the repair information of the first memory is stored in the second memory.

In an exemplary embodiment, the first memory and the second memory may belong to a same storage device, or may belong to different storage devices. The types of the first memory and the second memory may be the same or different, when they belong to different storage devices. For example, they may be all DRAM chips; or, for example, one is a DRAM and another is an SRAM.

Specifically, if there are multiple memory chips that have been determined by tests to operate normally, the state of each memory chip may be saved, for example, the current state of each memory chip may be recorded. For example, if data (here, any data) has been stored in a certain memory chip, the state of this memory chip may be marked as "1", which means that this memory chip is occupied. In this case, the repair information of the first memory will not be stored in this memory chip. Conversely, if no data is currently stored in a certain memory chip, the state of this memory chip may be marked as "0". In this case, this memory chip may be used as the second memory in which part or all of the repair information of the first memory is stored.

The memory test method in the embodiment of the present disclosure can use memories other than the ATE to store the repair information of the tested memory which is under test, thereby increasing the storage space for the repair information of the tested memory. On one hand, for the test of a large-capacity memory, there is no need to increase the memory space internal to the ATE, which reduces the test cost; and on the other hand, there is no need to repair the tested memory for multiple times, which improves the test speed, speeds up the test process, and shortens the test time.

Figure 3:
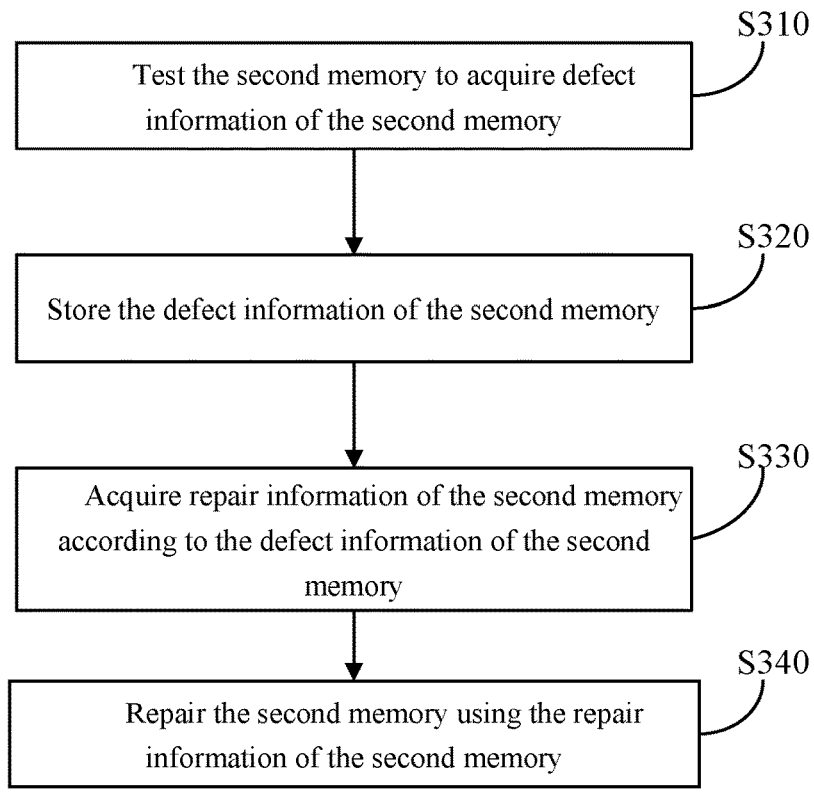
FIG. 3 schematically shows a flowchart of a memory test method according to an embodiment of the present disclosure.

FIG. 3 schematically shows a flowchart of a memory test method according to an embodiment of the present disclosure. As shown in FIG. 3, the difference from the above embodiments is that the method in the embodiment of the present disclosure may further comprise the following steps before testing the first memory.

In S310, the second memory is tested to acquire defect information of the second memory.

In S320, the defect information of the second memory is stored.

In S330, repair information of the second memory is acquired according to the defect information of the second memory.

In S340, the second memory is repaired according to the repair information of the second memory.

In the embodiment of the present disclosure, before storing the repair information of the first memory in the second memory, it is necessary to ensure that the second memory can be used normally. Therefore, the ATE first tests the second memory. Here, when the ATE tests the second memory, the defect information and repair information of the second memory may be stored in the ATE, and a storage unit in the second memory that has an error may be repaired according to the repair information of the second memory stored in the memory space internal to the ATE.

Figure 4:
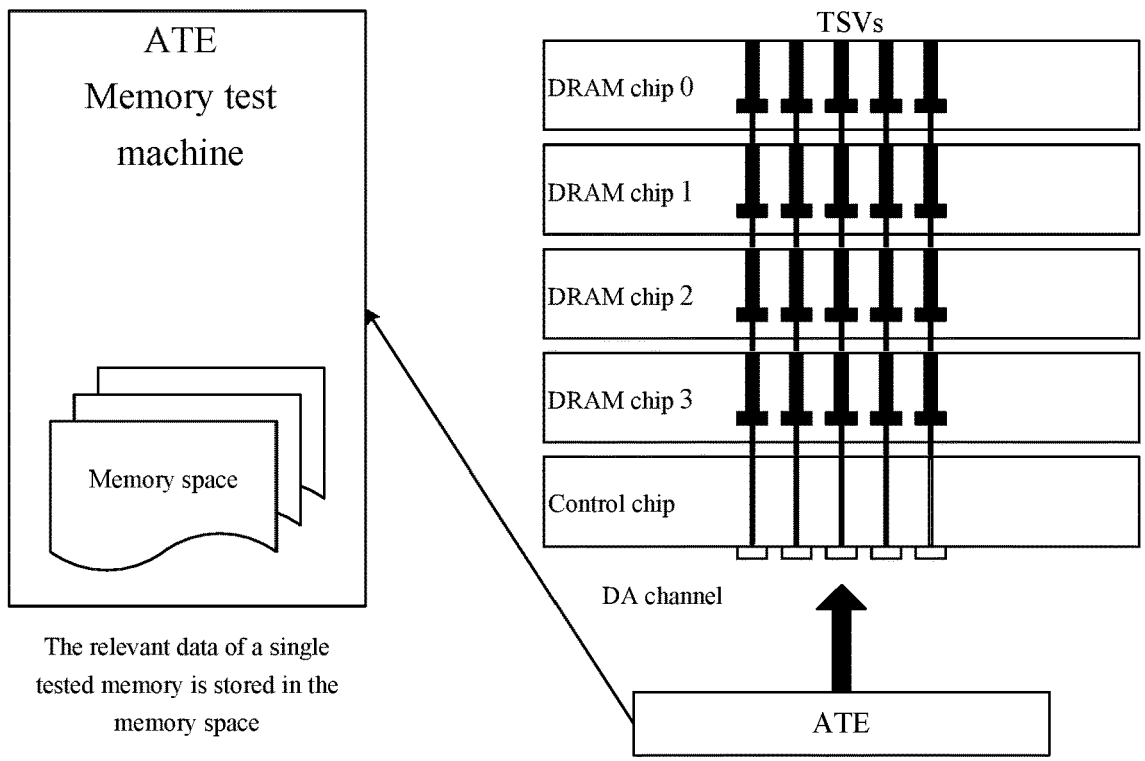
FIG. 4 schematically shows a schematic diagram of a memory test method according to an embodiment of the present disclosure.

Hereinafter, the method in the embodiment will be exemplified with reference to FIG. 4. A certain storage device is taken as an example, comprising four DRAM chips 0-3 and a control die. The DRAM chips 0-3 are vertically stacked on the control die in sequence. Here, it is assumed that the DRAM chip 0 is used as the second memory, and any one or part or all of the DRAM chips 1-3 are used as the first memory. Then, the ATE firstly tests the DRAM chip 0, and directly stores the defect information and repair information of the DRAM chip 0 in the memory space of the ATE (that is, the relevant data of the single tested memory shown in FIG. 4 is stored in the memory space, here the relevant data refers to the defect information and repair information of the DRAM chip 0). After the repair of the DRAM chip 0 is completed, the defect information and repair information of any one or part or all of the DRAM chips 1-3 are stored in the DRAM chip 0. That is, only the defect information and repair information of a single tested memory need to be stored in the memory space of the ATE, and the defect information and repair information of all tested memories do not need to be stored in the memory space of the ATE.

In stacked storage devices, several DRAM chips are vertically stacked. Compared with traditional storage devices, stacked storage devices have advantages in connection, bandwidth, and delay. Such an arrangement saves space, provides shorter chip spacing, and shortens the signal transmission path and delay. In stacked storage devices, edges or specific positions of the DRAM chips are perforated by through-silicon-vias which facilitates, as passages, wiring and vertical interconnection.

Figure 5:
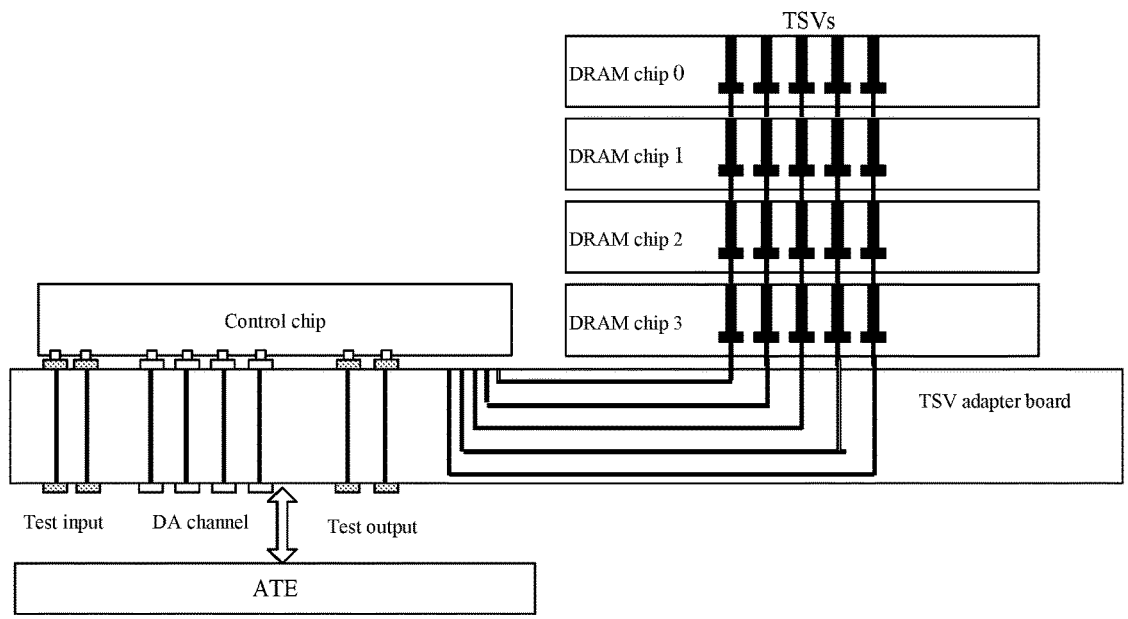
FIG. 5 schematically shows a schematic diagram of a memory test method according to an embodiment of the present disclosure.

The difference between the embodiment of FIG. 5 and the embodiment of FIG. 4 is that the DRAM chips 0-3 are vertically stacked in sequence, and the vertically stacked DRAM chips 0-3 and the control die may be connected horizontally through a TSV adapter board. Similarly, only the relevant data (for example, defect information and repair information) of a single tested memory needs to be stored in the memory space of the ATE, not the relevant data of all tested memories.

In stacked storage devices, although vertical stacking allows a higher density of memory chips in the same space, it is difficult for the control die to manage the memory chips. Therefore, in the other embodiment of FIG. 6, a new control level may be introduced into the control mechanism comprising only one level originally. Bases/logic dies may be arranged at the bottom of the TSV memory chips as a control die 2, on which DRAM chips are stacked in cluster. These bases/logic dies will directly communicate with the control die 1 comprising GPU/CPU/Soc/and the like, and may be used to collect data in the stacked DRAM chips and help the control die 1 comprising GPU/CPU/Soc/and the like to manage them. In the stacked system, the control die 1 comprising GPU/CPU/Soc/and the like will not even have significant change in scale. It only needs to face the control die 2 in the bases/logic dies. The management of the DRAM chips in each layer in each cluster is completed by the bases/logic dies. Therefore, the embodiment of FIG. 6 comprises both the control die 1 comprising GPU/CPU/Soc/ and the like, and the bases/logic dies as the control die 2.

Figure 6:
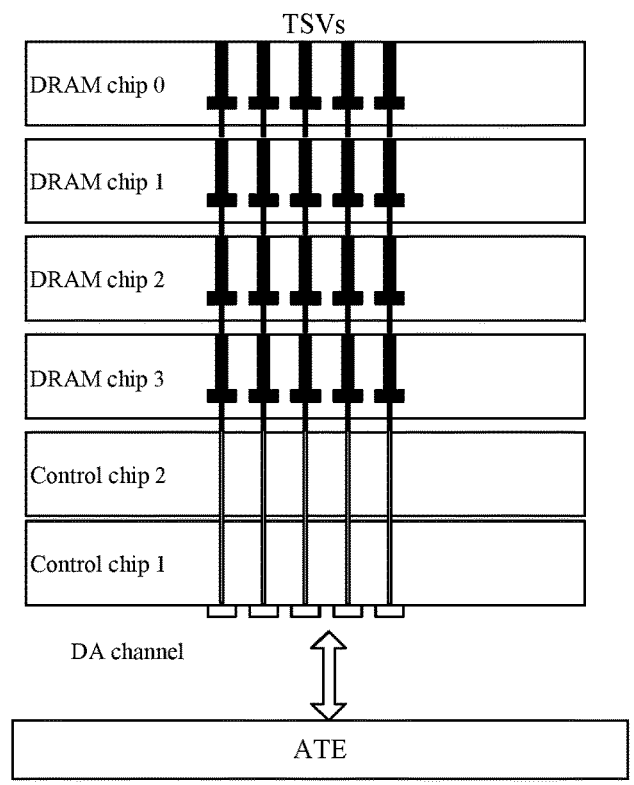
FIG. 6 schematically shows a schematic diagram of a memory test method according to an embodiment of the present disclosure.
Figure 7:
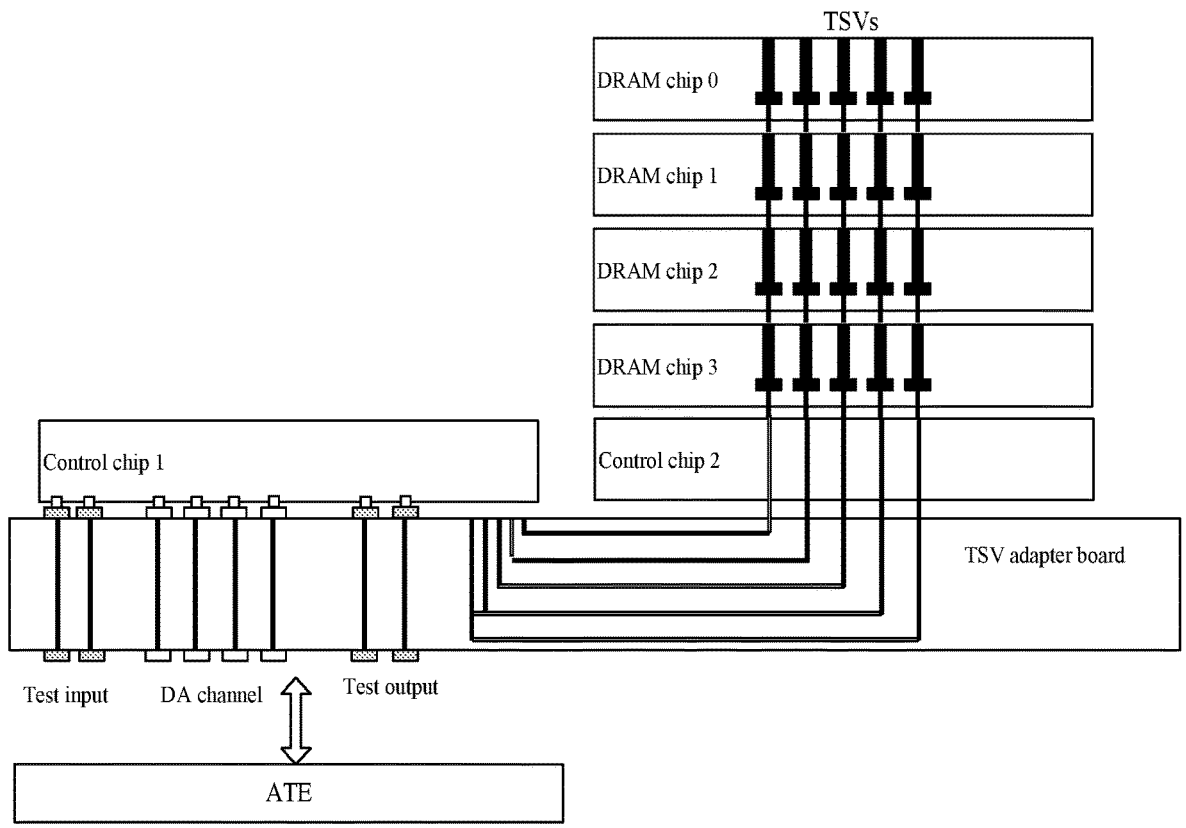
FIG. 7 schematically shows a schematic diagram of a memory test method according to an embodiment of the present disclosure.

The difference between the embodiment of FIG. 7 and the embodiment of FIG. 6 is that the control die 1, the control die 2 and the DRAM chips in the embodiment of FIG. 6 are vertically stacked in sequence, while in the embodiment of FIG. 7, the control die 1 and the control die 2 are horizontally connected through a TSV adapter board, the control die 2 and the DRAM chips are still vertically stacked in sequence.

Figure 8:
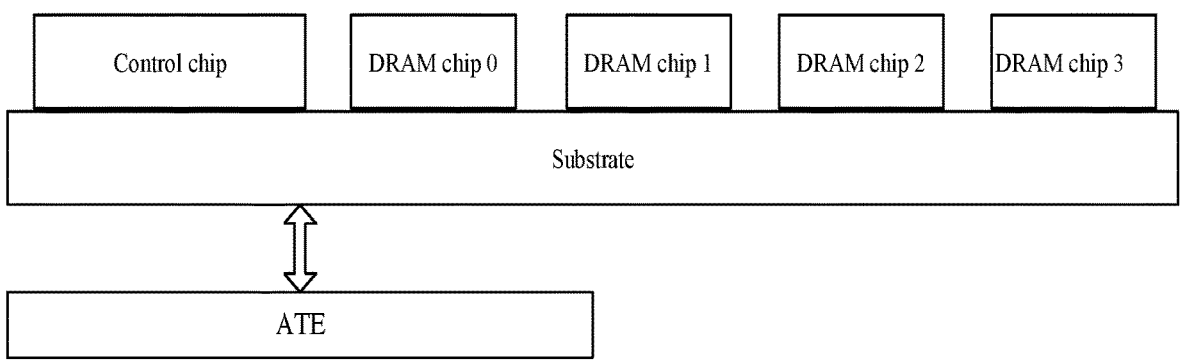
FIG. 8 schematically shows a schematic diagram of a memory test method according to an embodiment of the present disclosure.

The difference between the embodiment of FIG. 8 and the embodiment of FIG. 4 is that the DRAM chips 0-3 and the control die are all horizontally distributed on the substrate of a same storage device. Similarly, only the defect location of a single tested memory needs to be stored in the memory space of the ATE, the defect locations of all tested memories do not need to be stored in the memory space of the ATE.

Figure 9:
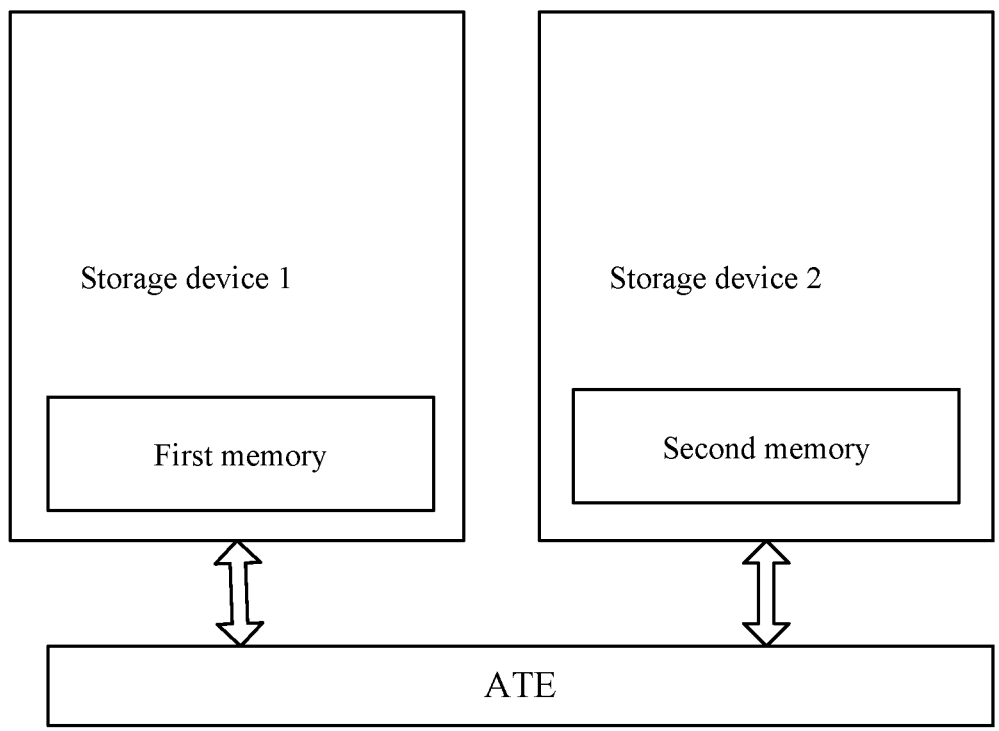
FIG. 9 schematically shows a schematic diagram of a memory test method according to an embodiment of the present disclosure.

In the above embodiments, the first memory and second memory are both located in a same storage device. In the embodiment of FIG. 9, the first memory and the second memory are located in different storage devices. Here, it is assumed that the first memory is located in a storage device 1, and the second memory is located in a storage device 2. The ATE first tests the second memory in the storage device 2, and then tests the first memory in the storage device 1, and can send the repair information of the first memory in the storage device 1 to the memory in the storage device 2 for storage.

Figure 10:
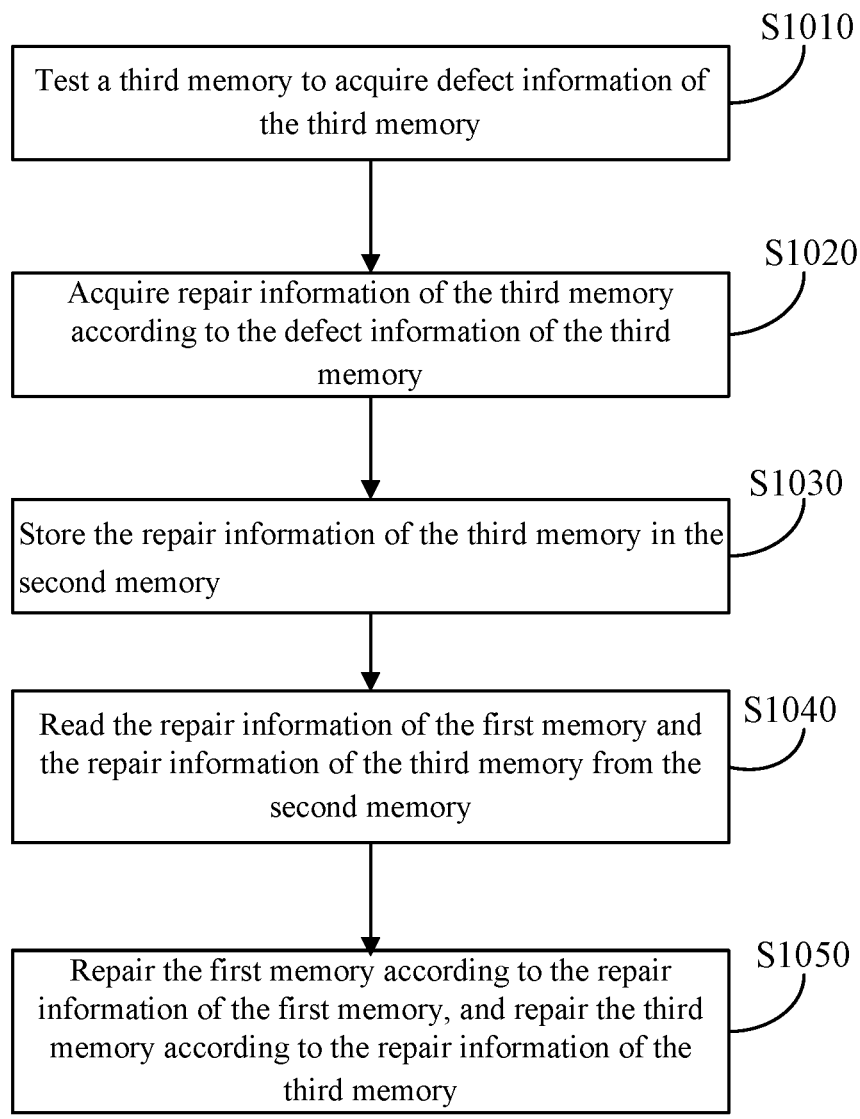
FIG. 10 schematically shows a flowchart of a memory test method according to an embodiment of the present disclosure.

FIG. 10 schematically shows a flowchart of a memory test method according to an embodiment of the present disclosure. As shown in FIG. 10, the difference from the above embodiments is that the method in the embodiment of the present disclosure may further comprise the following steps before testing the first memory.

In S1010, a third memory is tested to acquire defect information of the third memory.

In S1020, repair information of the third memory is acquired according to the defect information of the third memory.

In S1030, the repair information of the third memory is stored in the second memory.

Similar to the process of testing the first memory, when the ATE tests the third memory, it finds out the defect information of the third memory and analyzes the defect information to obtain the repair information. Also, the repair information of the third memory is not stored in the ATE. Instead, the repair information of the third memory is sent to the second memory for storage.

In S1040, the repair information of the first memory and the repair information of the third memory are read from the second memory.

In S1050, the first memory is repaired according to the repair information of the first memory, and the third memory is repaired according to the repair information of the third memory.

In the embodiment of the present disclosure, when the tests of the first memory and the third memory are completed, the ATE reads the repair information of the first memory and the repair information of the third memory from the second memory, and repairs the first memory and the third memory, respectively.

An example will be given below with reference to the embodiment of FIG. 11. Here, it is assumed that the DRAM chip 0 is the second memory, the DRAM chip 1 is the first memory, and the DRAM chip 2 is the third memory. The ATE first tests the DRAM chip 0, detects the defect information and the spare circuit information of the DRAM chip 0, stores the defect location and the spare circuit information of the DRAM chip 0 in the memory space internal to the ATE, and then analyzes to acquire the repair information of the DRAM chip 0; and then, repairs the DRAM chip 0 according to the repair information of the DRAM chip 0. After the DRAM chip 0 is repaired, the ATE needs to test the DRAM chip 0 again. The above steps are repeated, until the DRAM chip 0 passes the test. If the DRAM chip passes at the first test, the DRAM chip 0 may not be repaired.

Then, the ATE tests the DRAM chip 1, and in the test process, detects the defect information and the spare circuit information of the DRAM chip 1, analyzes the defect information to acquire the repair information of the DRAM chip 1, and stores the repair information of the DRAM chip 1 in the DRAM chip 0.

Then, the ATE tests the DRAM chip 2, and in the test process, detects the defect information and the spare circuit information of the DRAM chip 2, analyzes the defect information to acquire the repair information of the DRAM chip 2, and stores the repair information of the DRAM chip 2 in the DRAM chip 0.

Then, the ATE tests the DRAM chip 3, and in the test process, detects the defect information and the spare circuit information of the DRAM chip 3, analyzes the defect information to acquire the repair information of the DRAM chip 3, and stores the repair information of the DRAM chip 3 in the DRAM chip 0.

Then, the ATE reads the repair information of the DRAM chips 1-3 from the DRAM chip 0, repairs the DRAM chips 1-3 according to their repair information, and then tests the DRAM chips 1-3 until it is confirmed that the DRAM chips 1-3 are repaired successfully.

In the above-mentioned test process, the ATE tests the DRAM chips 1-3 in series. That is, the ATE tests the DRAM chips 1-3 one by one. However, in other embodiments, the ATE can test the DRAM chips 1-3 in parallel. That is, the ATE tests the DRAM chips 1-3 simultaneously.

It is to be noted that the above is only an example using the DRAM chip 0 as the second memory. In fact, the repair information of a tested memory may be stored in any memory chip that has been determined by tests to operate normally or in any part of a memory that has been repaired.

Figure 11:
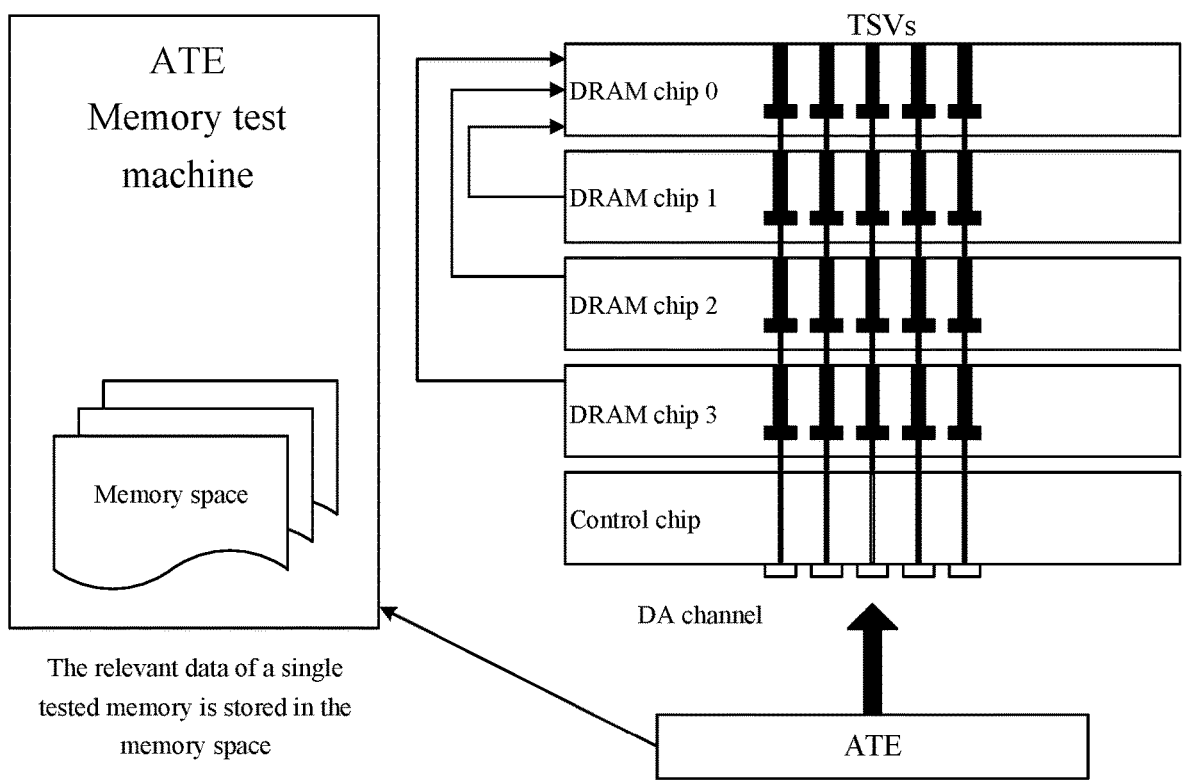
FIG. 11 schematically shows a schematic diagram of a memory test method according to an embodiment of the present disclosure.

It may be understood that, although the DRAM chips in the embodiment of FIG. 11 are vertically stacked on the control die in sequence, according to the above embodiments, the structural layout between the memory chips and the control die in the storage device is not limited in the present disclosure.

Figure 12:
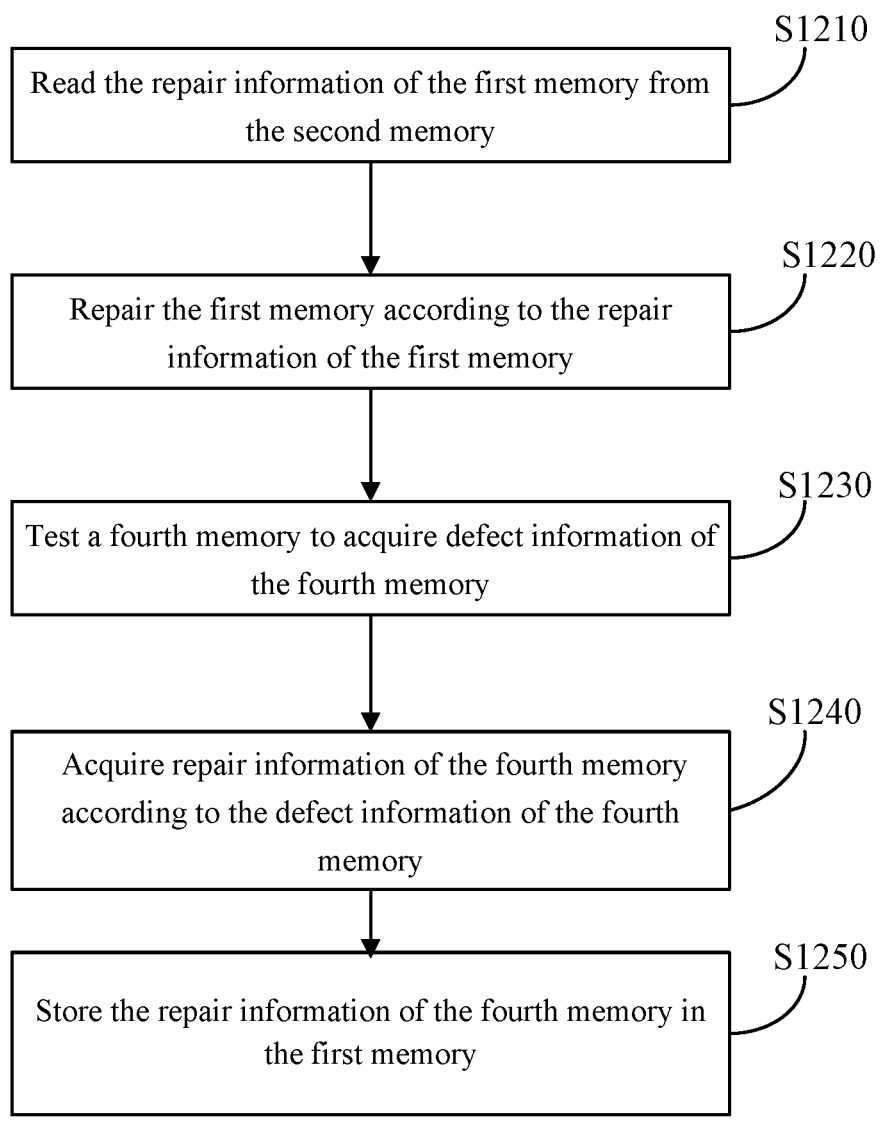
FIG. 12 schematically shows a flowchart of a memory test method according to an embodiment of the present disclosure.

FIG. 12 schematically shows a flowchart of a memory test method according to an embodiment of the present disclosure. As shown in FIG. 12, the difference from the above embodiments is that the method in the embodiment of the present disclosure may further comprise the following steps.

In S1210, the repair information of the first memory is read from the second memory.

In S1220, the first memory is repaired according to the repair information of the first memory.

In the embodiment of the present disclosure, the ATE may first read the repair information of the first memory from the second memory, and then repair the first memory to use it as a storage space for the repair information of other tested memories.

In S1230, a fourth memory is tested to acquire defect information of the fourth memory.

In S1240, repair information of the fourth memory is acquired according to the defect information of the fourth memory.

In S1250, the repair information of the fourth memory is stored in the first memory.

In the embodiment of the present disclosure, the ATE may test the fourth memory again, and then store the repair information of the fourth memory in the first memory that has been repaired.

Figure 13:
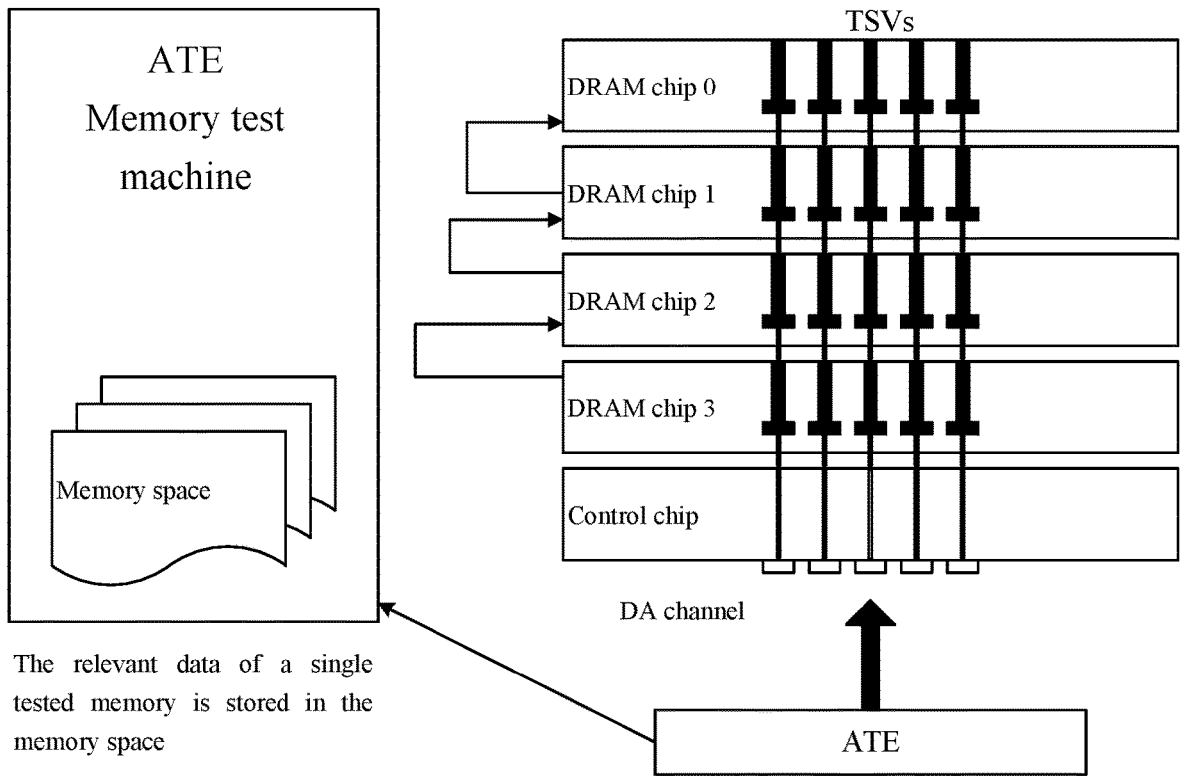
FIG. 13 schematically shows a schematic diagram of a memory test method according to an embodiment of the present disclosure.

An example will be given below with reference to the embodiment of FIG. 13. Here, it is assumed that the DRAM chip 0 is the second memory, the DRAM chip 1 is the first memory, and the DRAM chip 2 is the fourth memory. The ATE first tests the DRAM chip 0, detects the defect information and the spare circuit information of the DRAM chip 0, stores the defect location and the spare circuit information of the DRAM chip 0 in the memory space internal to the ATE, and then analyzes to acquire the repair information of the DRAM chip 0; and then, repairs the DRAM chip 0 according to the repair information of the DRAM chip 0. After the DRAM chip 0 is repaired, the ATE needs to test the DRAM chip 0 again. The above steps are repeated, until the DRAM chip 0 passes the test. If the DRAM chip passes at the first test, the DRAM chip 0 may not be repaired.

Then, the ATE tests the DRAM chip 1, and in the test process, detects the defect information and spare circuit information of the DRAM chip 1, analyzes the defect information to acquire the repair information of the DRAM chip 1, and stores the repair information of the DRAM chip 1 in the DRAM chip 0.

Then, the ATE reads the repair information of the DRAM chip 1 from the DRAM chip 0, and repairs the DRAM chip 1. After the DRAM chip 1 is repaired, the ATE needs to test the DRAM chip 1 again. The above steps are repeated, until the DRAM chip 1 passes the test. If the DRAM chip passes at the first test, the DRAM chip 1 may not be repaired. The ATE tests the DRAM chip 2, and in the test process, detects the defect information and the spare circuit information of the DRAM chip 2, analyzes the defect information to acquire the repair information of the DRAM chip 2, and stores the repair information of the DRAM chip 2 in the DRAM chip 1.

Then, the ATE reads the repair information of the DRAM chip 2 from the DRAM chip 1, and repairs the DRAM chip 2. After the DRAM chip 2 is repaired, the ATE needs to test the DRAM chip 2 again. The above steps are repeated, until the DRAM chip 2 passes the test. If the DRAM chip 2 passes at the first test, the DRAM chip 2 may not be repaired. The ATE tests the DRAM chip 3, and in the test process, detects the defect information and the spare circuit information of the DRAM chip 3, analyzes the defect information to acquire the repair information of the DRAM chip 3, and stores the repair information of the DRAM chip 3 in the DRAM chip 2.

Then, the ATE reads the repair information of the DRAM chip 3 from the DRAM chip 2, and repairs the DRAM chip 3. After the DRAM chip 3 is repaired, the ATE needs to test the DRAM chip 3 again. The above steps are repeated, until the DRAM chip 3 passes the test. If the DRAM chip 3 passes at the first test, the DRAM chip 3 may not be repaired.

Figure 14:
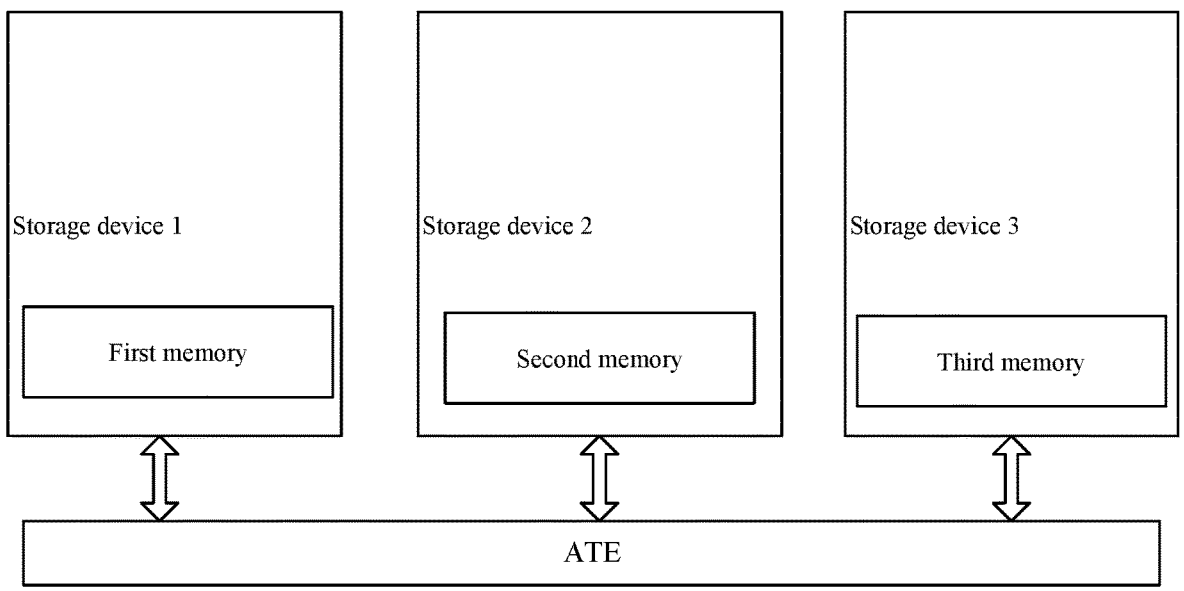
FIG. 14 schematically shows a schematic diagram of a memory test method according to an embodiment of the present disclosure.

In the above example, the description is given in the case that the first memory, the second memory, and the third memory are all located in a same storage device. The present disclosure is not limited thereto. In the embodiment of FIG. 14, it is assumed that the first memory is located in a storage device 1, the second memory is located in a storage device 2, and the third memory is located in a storage device 3. The ATE first tests the second memory in the storage device 2, and then tests the first memory in the storage device 1, and can send the repair information of the first memory in the storage device 1 to the second memory in the storage device 2 for storage. Then, the ATE may test the third memory in the storage device 3, and then send the repair information of the third memory in the storage device 3 to the second memory in the storage device 2 for storage. Then, the ATE may read the repair information of the first memory and the repair information of the third memory from the second memory in the storage device 2, and repair the first memory and the third memory respectively. Alternatively, the ATE may repair the storage device 1 firstly, and then test the third memory in the storage device 3, and can send the repair information of the third memory in the storage device 3 to the first memory in the storage device 1 for storage.

In an exemplary embodiment, the method further comprises: acquiring test data of the first memory; and storing the test data of the first memory in the second memory.

In the embodiment of the present disclosure, the second memory that has been determined by test to operate normally is not limited to only be used to record the repair information of a tested memory. In other embodiments, it may be used to store other arbitrary data, for example, the test data of the first memory. The test data here may be, for example, test vectors used to test the first memory, or result data of testing the first memory by the test vectors, and the like.

Figure 15:
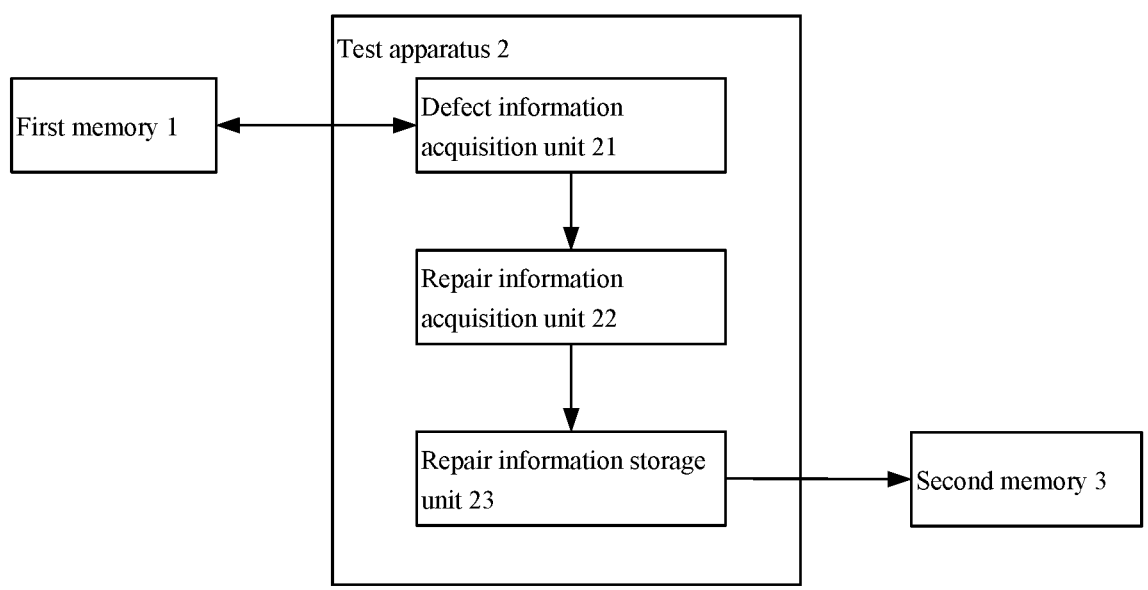
FIG. 15 schematically shows a schematic diagram of a memory test apparatus according to an embodiment of the present disclosure.

FIG. 15 schematically shows a schematic diagram of a memory test apparatus according to an embodiment of the present disclosure. As shown in FIG. 15, in the embodiment of the present disclosure, the test apparatus 2 may comprise: a defect information acquisition unit 21, a repair information acquisition unit 22, and a repair information storage unit 23.

The defect information acquisition unit 21 is configured to test a first memory 1 to acquire defect information of the first memory 1. The repair information acquisition unit 22 is configured to acquire repair information of the first memory 1 according to the defect information of the first memory 1. The repair information storage unit 23 is configured to store the repair information of the first memory 1 in the second memory 3.

In an exemplary embodiment, the test apparatus 2 may further comprise: a second memory test unit which may be configured to test the second memory before testing the first memory, to acquire defect information of the second memory; a second memory defect information storage unit which may be configured to store defect information of the second memory; a second memory repair information acquisition unit which may be configured to acquire repair information of the second memory according to the defect information of the second memory; and a second memory repair unit which may be configured to repair the second memory according to the repair information of the second memory.

In an exemplary embodiment, the first memory and the second memory may belong to a same storage device.

In an exemplary embodiment, the storage device may further comprise a control die, and the first memory and the second memory may be vertically stacked above or below the control die in sequence.

In an exemplary embodiment, the first memory and the second memory may belong to different storage devices, and the types of the different storage devices may be the same or different.

In an exemplary embodiment, the test apparatus 2 may further comprise: a third memory test unit which may be configured to test a third memory, to acquire defect information of the third memory; a third memory repair information acquisition unit which may be configured to acquire repair information of the third memory according to the defect information of the third memory; and a third memory repair information storage unit which may be configured to store the repair information of the third memory in the second memory.

In an exemplary embodiment, the test apparatus 2 may further comprise: a first repair information read unit which may be configured to read the repair information of the first memory and the repair information of the third memory from the second memory; and a first memory repair unit which may be configured to repair the first memory according to the repair information of the first memory, and repair the third memory according to the repair information of the third memory.

In an exemplary embodiment, the test apparatus 2 may further comprise: a second repair information read unit which may be configured to read the repair information of the first memory from the second memory; and a second memory repair unit which may be configured to repair the first memory according to the repair information of the first memory.

In an exemplary embodiment, the test apparatus 2 may further comprise: a fourth memory test unit which may be configured to test a fourth memory, to acquire defect information of the fourth memory; a fourth memory repair information acquisition unit which may be configured to acquire repair information of the fourth memory according to the defect information of the fourth memory; and a fourth memory repair information storage unit which may be configured to store the repair information of the fourth memory in the first memory.

In an exemplary embodiment, the test apparatus 2 may further comprise: a test data acquisition unit which may be configured to acquire test data of the first memory; and a test data storage unit which may be configured to store the test data of the first memory in the second memory.

In an exemplary embodiment, the automatic test equipment may comprise the test device 2.

Further, an embodiment of the present disclosure further provides an electronic device. The electronic device may comprise: one or more processors; and a storage apparatus, configured to store one or more programs; and the one or more programs causes, when executed by the one or more processors, the one or more processors to implement the methods described in the embodiments. Further, an embodiment of the present disclosure further provide a computer-readable storage medium having a computer program stored thereon that, when executed by a processor, causes the processor to implement the methods described in the embodiments. Other contents may refer to the above method embodiments.

Those skilled in the art will readily think of other embodiments of the present disclosure by considering the specification and practicing the application disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

What is claimed is:

1. A memory test method, comprising:
   testing a second memory to acquire defect information of the second memory;
   storing the defect information of the second memory;
   acquiring repair information of the second memory according to the defect information of the second memory;
   repairing the second memory according to the repair information of the second memory;
   testing a first memory to acquire defect information of the first memory;
   acquiring repair information of the first memory according to the defect information of the first memory; and
   storing the repair information of the first memory in the second memory.

2. The memory test method according to claim 1, wherein the first memory and the second memory belong to a same storage device.

3. The memory test method according to claim 2, wherein the storage device further comprises a control die, and the first memory and the second memory are vertically stacked above or below the control die in sequence.

4. The memory test method according to claim 1, wherein the first memory and the second memory belong to different storage devices, and the types of the different storage devices are the same or different.

5. The memory test method according to claim 1, further comprising:
   reading the repair information of the first memory from the second memory; and
   repairing the first memory according to the repair information of the first memory.

6. The memory test method according to claim 5, further comprising:
   testing a fourth memory to acquire defect information of the fourth memory;
   acquiring repair information of the fourth memory according to the defect information of the fourth memory; and
   storing the repair information of the fourth memory in the first memory.

7. The memory test method according to claim 1, further comprising:
    acquiring test data of the first memory; and
    storing the test data of the first memory in the second memory.

8. The memory test method according to claim 1, wherein the method is executed by an automatic test equipment.

9. An electronic device, comprising:
    one or more processors; and
    a storage apparatus, configured to store one or more programs;
    the one or more programs causes, when executed by the one or more processors, the one or more processors to implement the method according to claim 1.

10. A non-transitory computer-readable storage medium having a computer program stored thereon, when executed by a processor, causes the processor to implement the method according to claim 1.

11. A memory test method, comprising:
    testing a first memory to acquire defect information of the first memory;
    acquiring repair information of the first memory according to the defect information of the first memory;
    storing the repair information of the first memory in a second memory;
    testing a third memory to acquire defect information of the third memory;
    acquiring repair information of the third memory according to the defect information of the third memory; and
    storing the repair information of the third memory in the second memory.

12. The memory test method according to claim 11, further comprising:
    reading the repair information of the first memory and the repair information of the third memory from the second memory; and
    repairing the first memory according to the repair information of the first memory, and repairing the third memory according to the repair information of the third memory.

13. A memory test apparatus, comprising:
    a defect information acquisition unit, configured to test a first memory to acquire defect information of the first memory;
    a repair information acquisition unit, configured to acquire repair information of the first memory according to the defect information of the first memory;
    a repair information storage unit, configured to store the repair information of the first memory in a second memory;
    a second memory test unit, configured to test the second memory before testing the first memory, to acquire defect information of the second memory;
    a second memory defect information storage unit, configured to store defect information of the second memory;
    a second memory repair information acquisition unit, configured to acquire repair information of the second memory according to the defect information of the second memory; and
    a second memory repair unit, configured to repair the second memory according to the repair information of the second memory.

\* \* \* \* \*